United States Patent
Liao et al.

(12) 
(10) Patent No.: US 6,359,309 B1
(45) Date of Patent: Mar. 19, 2002

(54) POWER MOSFET AND IGBT WITH OPTIMIZED ON-RESISTANCE AND BREAKDOWN VOLTAGE

(75) Inventors: Chungpin Liao, Taichung; Dar-Chang Juang, Hsin-Chu, both of (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/713,803

(22) Filed: Nov. 16, 2000

Related U.S. Application Data

(62) Division of application No. 09/225,375, filed on Jan. 4, 1999, now Pat. No. 6,190,970.

(51) Int. Cl.[7] .................... H01L 31/119; H01L 21/336
(52) U.S. Cl. .................. 257/341; 257/344; 438/269
(58) Field of Search ................................ 257/341, 135, 257/129, 137, 139, 153, 328, 333, 327, 344; 438/269

(56) References Cited

U.S. PATENT DOCUMENTS

| | | | |
|---|---|---|---|
| 5,648,283 A | * | 7/1997 | Tsang et al. .............. 438/138 |
| 5,714,774 A | | 2/1998 | Otsuki et al. .............. 257/138 |
| 5,742,087 A | | 4/1998 | Lidow et al. .............. 257/342 |
| 5,831,291 A | * | 11/1998 | Evans et al. .............. 257/137 |
| 5,894,149 A | * | 4/1999 | Uenishi et al. ............ 257/331 |

* cited by examiner

*Primary Examiner*—Charles Bowers
*Assistant Examiner*—Brook Kebede
(74) *Attorney, Agent, or Firm*—George O. Saile; Stephen B. Ackerman

(57) ABSTRACT

A MOSFET and IGBT are described that exhibit high breakdown voltage together with low on-resistance. This is achieved by providing an N type shunt that extends from the N+ drain (for power MOSFETs) or P+ emitter (for IGBTs), through the N− region to a short distance below the gate oxide. To manufacture such a shunt, an epi wafer with N−epitaxy is first provided on top of an N+ (for power MOSFET) or P+ (for IGBT) layer. Through a suitable mask (contact or freestanding) on the top surface, the wafer is then subjected to bombardment by protons or deuterons. Because of ion transmutation doping, a region of N type material forms wherever the surface is not masked. By controlling the energies of the ions, this region is caused to extend below the wafer's surface so as to just contact the N+ or P+ layer or even to go through it. To convert shunt material in the immediate vicinity of the gate oxide back to N−, either counter-doping or trenching followed by dielectric filling and CMP are used.

2 Claims, 4 Drawing Sheets

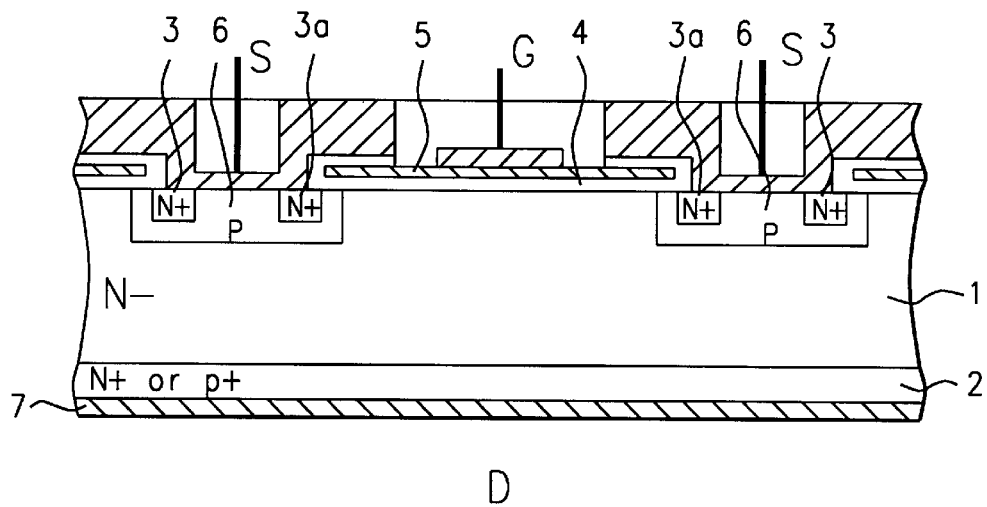
FIG. 1 – Prior Art
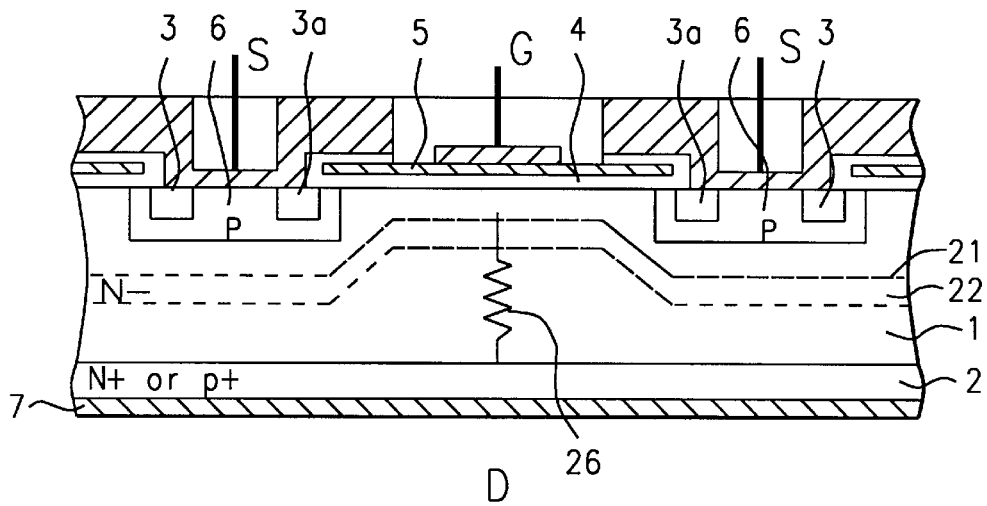
FIG. 2 – Prior Art

POWER MOSFET AND IGBT WITH OPTIMIZED ON-RESISTANCE AND BREAKDOWN VOLTAGE

This is a division of patent application Ser. No. 09/225,375 filing date Jan. 4, 1999 now U.S. Pat. No. 6,190,970, Power Mosfet And lgbt With Optimized On-Resistance And Breakdown Voltage, assigned to the same assignee as the present invention.

FIELD OF THE INVENTION

The invention relates to the general field of power MOSFETs and IGBTs with particular reference to structures that optimize performance and methods for manufacturing same.

BACKGROUND OF THE INVENTION

For low power applications, metal-oxide-semiconductor field effect transistors (MOSFETS) normally follow a simple design with source, drain and gate arranged in the same plane. When such devices are produced in high power versions capable of handling hundreds of watts, different geometries are indicated. Such devices are generally referred to as power MOSFETs. Closely related to power MOSFETs are the IGBTs (insulated gate bipolar transistors) which are used in place of MOSFETs when large operational current is desired.

Since the geometries of the MOSFET and IGBT are very similar, we illustrate them here in a single figure (FIG. 1). Shown in schematic cross-section is an epitaxial silicon wafer made up of a high resistivity (typically about 500 ohm cm.) epitaxial N− region 1 sitting atop a highly doped N+ or P+ silicon wafer 2. Sources 3 and 3a of the device are N+ regions which serve as sources for each pair of NMOSs and are directed into the plane of the figure. The inversion region of the NMOSs is shown as P type region 6 while the N−epitaxial layer 1 serves as the extended drain region of the NMOSs for the power MOSFET or as the PNP transistor's base region. Gate oxide 4 extends above the neck region between two pairs of NMOS, overlapping slightly with region 6 on its two sides. Layer 5 is the gate electrode that rests on the gate oxide.

Thus, when sufficient positive voltage is applied to 5, an N type channel region is formed in 6 between 3a and 1 and between 3 and 1 and the device is turned on. In the case of a power MOSFET, current entering 1 (extended drain) flows down to region 2 which is an N+ silicon wafer upon which a metallic drain contact 7 is made. In the case of an IGBT, region 2 is P+ so the result is a combination of an nMOS device and a pnp transistor, with 7 being the emitter ohmic contact, 1 being the emitter, and 6 and its metal contact above being the collector, and region 1 being the base. Turn-on of the NMOSs supplies current to the base of the pnp transistor, thus turning it on.

While the design shown in FIG. 1 is widely used, it is not entirely satisfactory. The reason for this is illustrated in FIG. 2. In the case of a power MOSFET, when voltage is applied to the gate (layer 5), a depletion region is formed beneath it. The edge of the depletion region for an applied voltage of 100 volts is illustrated as dotted line 21 while the depletion edge for 200 volts is shown as dotted line 22. Once electrons have crossed from 3a into 1 by way of 6, they traverse the depletion region and enter the bulk of N-31 region 1. In order for the breakdown voltage sustained between 5 and 1 to be kept as high as possible, the resistivity of 1 must be made as high as possible. Because of this, electrons traversing 1 encounter a series resistance which has been symbolized as resistor 26 in the figure. Series resistance of this kind is detrimental to device performance so a tradeoff has to be made between on-resistance and breakdown voltage.

Similar considerations apply to the IGBT design where a tradeoff has to be made between base resistivity and breakdown voltage. In practice, a fully satisfactory compromise cannot be made so the result is an ineffective combination of nMOS and pnp BJT (bipolar junction transistor). The present invention presents a solution to this problem whereby both high breakdown voltage and low on-resistance can be achieved in the same device.

A search of the prior art revealed the existence of many references to devices of the type illustrated in FIG. 1. Some modifications to the doping profile of the N−region are described with a view to optimizing the above discussed tradeoff, but they are severely limited as to what can be achieved. Typical examples are Lidow et al. (U.S. Pat. No. 5,742,087 April 1998) who form a relatively low resistivity epitaxial region on the surface prior to the formation of the source and gate, and Otsuki et al. (U.S. Pat. No. 5,714,774 February 1998) who use double emitters to obtain thyristor action as a way of reducing on-resistance.

SUMMARY OF THE INVENTION

It has been an object of the present invention to provide MOSFET and IGBT structures that have both high breakdown voltage and low on-resistance.

Another object of the invention has been to provide methods for manufacturing said devices.

These objects have been achieved by providing an N type shunt that extends from the N+ drain (for MOSFETs) or P+ emitter (for IGBTs), through the N−region to a short distance below the gate oxide. To manufacture such a shunt, an epitaxial layer of Nsilicon is first provided with an N+ or P+ silicon substrate on its bottom surface. Through a suitable mask (contact or freestanding) on the top surface, the epi wafer is then subjected to bombardment by protons or deuterons. Because of ion transmutation doping, a region of N type material forms wherever the surface is not masked. By controlling the energies of the ions, this region can be caused to extend below the wafer's surface so as to just contact the N+ or P+ layer. Or the ions can simply be allowed to pass through the whole epi wafer. To convert shunt material in the immediate vicinity of the gate oxide back to N− either counter-doping or trenching followed by dielectric filling and polishing are used.

BRIEF DESCRIPTION OF THE DRAWINGS

FIG. 1 is a schematic cross-section of a standard power MOSFET or IGBT.

FIG. 2 illustrates how the structure shown in FIG. 1 has an inherent series resistance built in.

DESCRIPTION OF THE PREFERRED EMBODIMENTS

Figure 3:
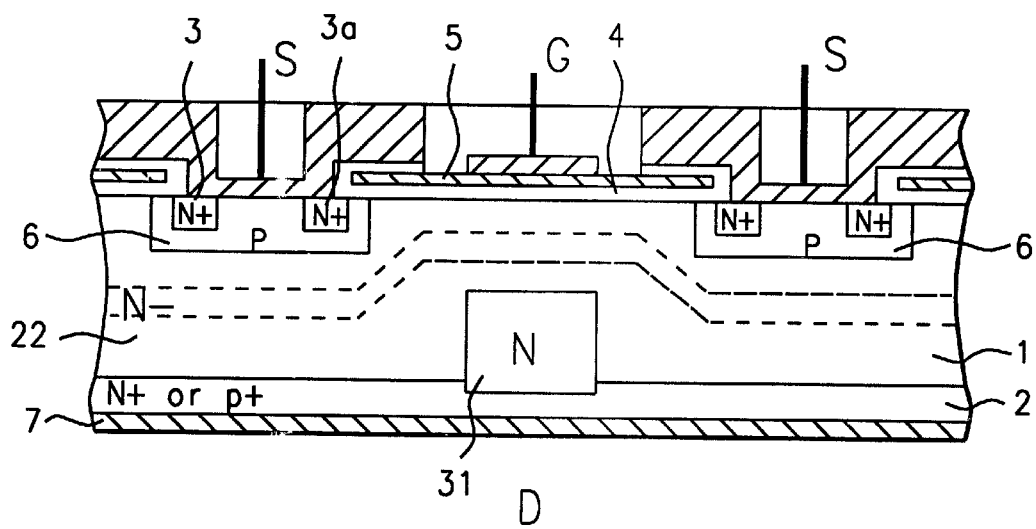
FIG. 3 shows the structure taught by the present invention.

In order to short circuit the series resistance symbolized by resistor 26 in FIG. 2, a shunt 31 is introduced. As illustrated in FIG. 3, this is a region of N type silicon that extends from just inside layer 2 to just below the edge of the depletion layer obtained at the highest anticipated applied voltage. In practice, the resistivity of the material of shunt 31 is between about 0.1 and 1 ohm cm. and the top of 31 is between about 0.5 and 5 microns from the top surface of the wafer (i.e. the lower surface of gate oxide layer 4).

Thus, it becomes possible to make layer 1 of relatively high resistivity N–material, thereby increasing breakdown voltage, without significantly increasing the on-resistance since this is now determined by the resistance of shunt 31. Such a structure does not (to the best of our knowledge) exist in the prior art because of the difficulty of realizing it using the standard techniques of semiconductor processing. Thus the method that we have used to form the structure illustrated in FIG. 3 is of considerable interest and will now be described in detail.

Figure 4:
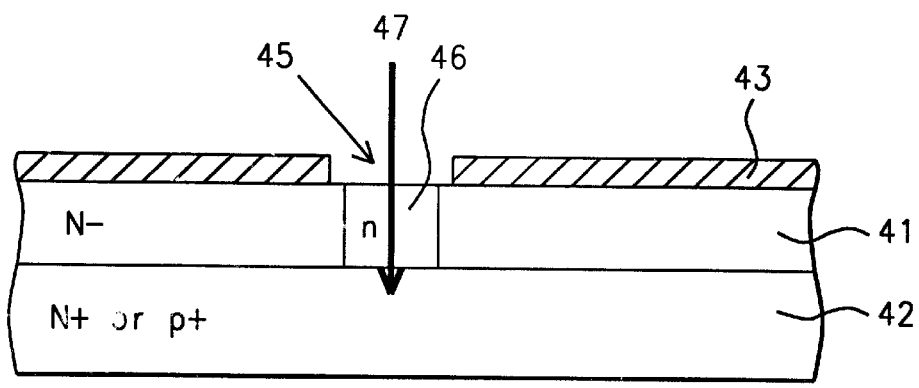
FIG. 4 shows how a region of N type material may be introduced through use of ion transmutation doping.

For a MOSFET, the method starts with the provision of an epi wafer of high resistance N– silicon epitaxy such as layer 41 sitting on substrate 42 in FIG. 4. The resistivity of layer 41 is typically between about 100 and 1,000 ohm cm. It is generally between about 5 and 50 microns thick. Region 42 is N+ silicon (for power MOSFET or P+ for IGBT) which serves as seed bed for the growth of epitaxial layer 41, and has resistivity between about 0.005 and 0.05 ohm cm.

Next, mask 43 is positioned above the top surface of 41. Two versions of said mask may be used. As shown in FIG. 4, the mask may be formed by first depositing a layer of high atomic number material such as tungsten or Ni/Fe alloy to a thickness between about 5 and 10 microns (for 1–1.6 MeV protons) following which opening 45 was etched out using standard patterning processes including lift-off with 5–10 micron thick photoresist. The alternative (not shown) was to etch an opening equivalent to opening 45 in layer 43 in a sheet of metal foil between about 100 and 500 microns thick (for 5–30 MeV protons), made of a material such as tungsten or Ni/Fe alloy, using existing LIGA technology, which would then be positioned between about 10 and 100 microns from the surface of 41 as a freestanding mask.

In a special feature of the invention, high resistance N-31 region 41 was then subjected to bombardment (through the mask) by either protons or deuterons (i.e. low atomic number ions having an atomic number less than 3.0) as symbolized by arrow 47. This resulted in the formation of N type region 46. The mechanism by which this occurs is ion transmutation doping. This process is new vis a vis the semiconductor industry. It is similar to its better known counterpart neutron transmutation doping (NTD).

The NTD process is based on the fact that, although silicon has an atomic number of 14 and an atomic weight of 28, naturally occurring silicon is not entirely made up of the $Si^{28}$ isotope. It turns out that $Si^{29}$ is present at a concentration of about 4.7 atomic % and $Si^{30}$ is present at a concentration of about 3.1 atomic %. Additionally, it turns out that $Si^{30}$, when bombarded by thermal neutrons, is transmuted to phosphorus $p^{31}$ (atomic number 15). Since the desired level of phosphorus doping is well below the 3.1 at.% of the already present $Si^{30}$, it is apparent that a limited amount of neutron bombardment of naturally occurring silicon, will result in the introduction of phosphorus dopant into the silicon. Such phosphorus dopant will be uniformly distributed and will also be in substitutional position in the lattice where it can act as a donor.

While the NTD process has been successfully applied on a number of occasions, it suffers from a major limitation that limits its usefulness in this instance. Because of their being isotropically emitted, neutrons are hard to focus onto a selected spot with high enough fluence. Protons and deuterons, being charged, can readily be focused onto selected spots with very high particle flux.

Recent experiments have shown that transmutation doping, similar to NTD, can be brought about by protons or deuterons, provided the particles possess certain minimum energies to overcome Coulomb repulsion. One undesirable side effect of ITD is that a small amount of sulfur gets formed along with the phosphorus. In the case of protons, the sulfur is readily removed by heating in vacuo during, and immediately after, bombardment but for deuterons sulfur continues to form for several weeks after bombardment so its full removal needs to be delayed. These disadvantages are more than offset by the fact that the capture cross-sections for the ions is of the same order of magnitude as for the neutrons. This, together with their ready availability from high flux sources, significantly reduces the time needed by the transmutation process.

Figure 5:
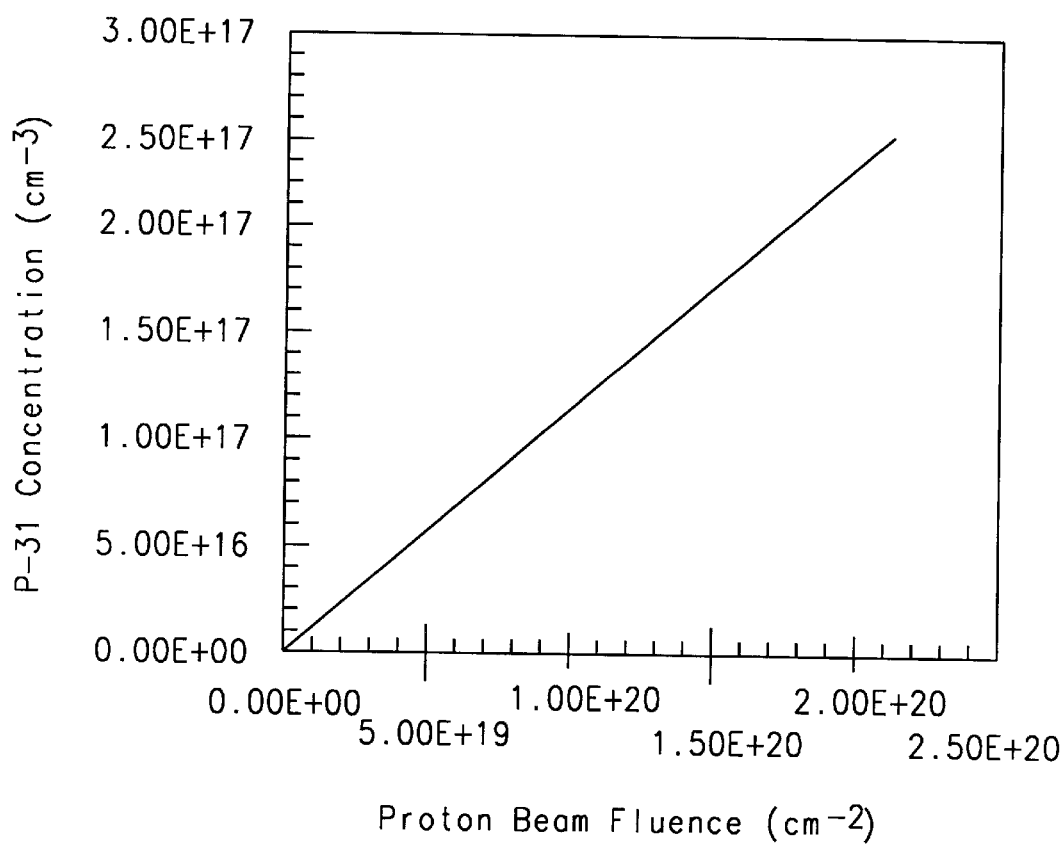
FIG. 5 is a plot of phosphorus concentration as a function of proton beam fluence.

In FIG. 5 we show a plot of phosphorus (transmuted silicon) concentration as a function of the proton beam fluence (in ions/sq. cm.). As can be seen, very high levels of N type doping are readily achieved. In order to produce a reliable beam of protons having energies above the minimum, a conventional compact cyclotron (for example 1.5 m diameter and 2.0 m height made by TRIUMF Co. of Canada) was found to be efficient and economical.

Figure 6:
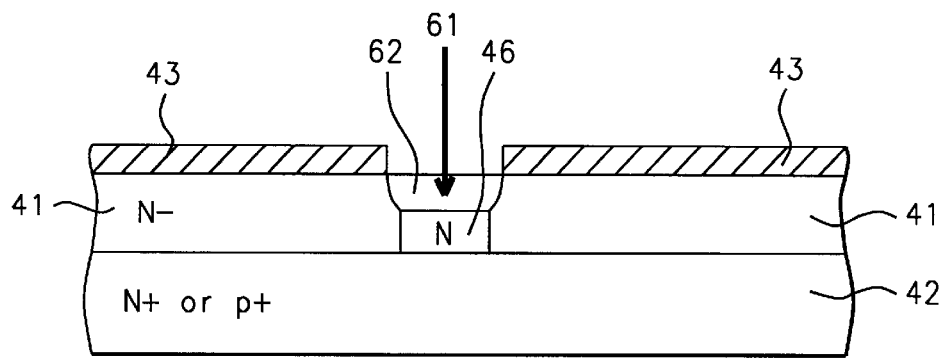
FIG. 6 illustrates how a portion of the shunt may be converted to N− material by means of counter-doping.

Returning briefly to FIG. 4, we note that the extent to which the ions penetrate layer 41 is such that shunt 46 passes right through the N– region 41 and just contacts N+ region 42 (or may even go through it if the proton mask is thick enough). To make this occur, ion energies between about 1 and 30 MeV were used. Two different subprocesses have been used in order to form said N– mregion:

The first subprocess is illustrated in FIG. 6. A diffusion step (symbolized by arrow 61) using acceptor impurities such as boron, is performed leaving the contact mask 43 in place. This can be a thick (5–10 microns) metal layer on an oxide layer or nitride layer and it was used for masking protons. Using existing diffusion methods, sufficient counter-doping occurred for the conductivity type to be changed from N to N– to a depth between about 0.5 and 5 microns below the surface (region 62 in FIG. 6).

Figure 7:
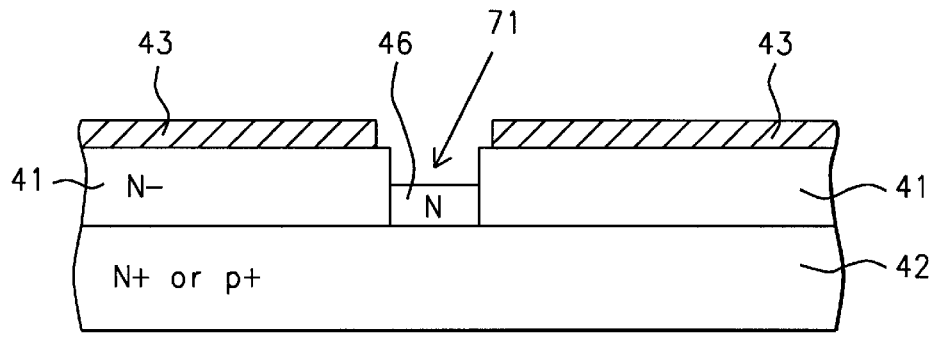
FIGS. 7 and 8 illustrate how the N− conversion can be accomplished by etching a trench and then filling with dielectric material (normally oxide followed by polysilicon).

For a description of the second subprocess, we refer to FIG. 7. Trench 71, corresponding in area to shunt 46 was etched into the top surface of 41 to a depth between about 0.5 and 5 microns using contact mask 43 which can be a thick (5–10 microns) metal layer on an oxide or nitride layer and was used for masking protons. The trench was then filled with oxide followed by polysilicon 83, following which the surface was planarized using chemical mechanical polishing. This resulted in the incidental removal of mask 43, giving the structure the appearance illustrated in FIG. 8, with the added dielectric material designated as layer 82.

Figure 8:
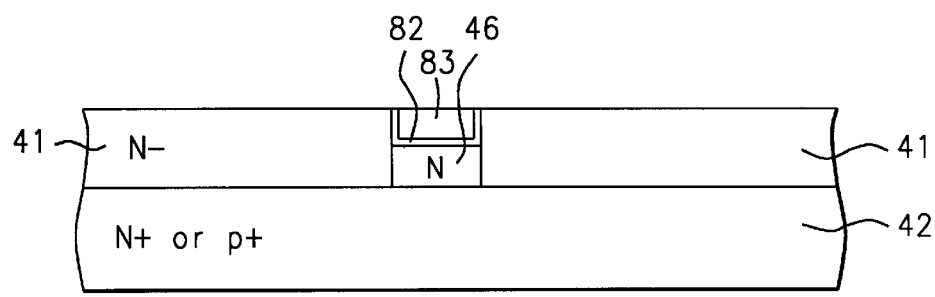

Once the structure shown in FIG. 6 or FIG. 8 had been formed, the remaining standard steps for the manufacture of a MOSFET device were performed, including the formation of source and gate regions in the upper surface of 41 as seen in FIG. 3.

The process steps for manufacturing an IGBT device according to the teachings of the present invention are quite similar to those described above except that layer 2 in FIG. 3, corresponding to layer 42 in FIGS. 4, 6, 7, and 8, is a P+ substrate instead of an N+ one and the various internal dimensions and dopant concentrations are now optimized for an IGBT.

While the invention has been particularly shown and described with reference to the preferred embodiments thereof, it will be understood by those skilled in the art that various changes in form and details may be made without departing from the spirit and scope of the invention.

What is claimed is:

1. An N channel MOSFET having low on resistance and a high breakdown voltage, comprising:

a high resistance body of N− epitaxial silicon atop a N+ drain in the form of an N+ silicon substrate;

a layer of gate insulation on a top surface of said high resistance body of N− epitaxial silicon;

a polysilicon gate on said layer of gate insulation;

a P type channel region extending downward from said top surface, vertically partially overlapping said polysilicon gate;

two N+ source regions, disposed within said P channel region;

ohmic contacts to said source and gate;

a metallic layer on said N+ drain from a back side of said N+ silicon substrate;

a shunt region of N type silicon in contact with, and extending upward from, said N+ drain, through said high resistance body of N− epitaxial silicon and terminating at a distance from said upper surface and underlying said polysilicon gate and not contacting said P type channel region; and wherein said distance is between about 0.5 and 5 microns.

2. An N channel insulated gate bipolar transistor (IGBT) having low on resistance and a high breakdown voltage, comprising. a high resistance body of N− epitaxial silicon, serving as both a drain for an NMOS device and a base for a bipolar junction transistor (BJT), on top of a P+ silicon substrate that serves as an emitter for said BJT;

a layer of gate insulation on a top surface of said body;

a polysilicon gate contact on said layer of gate insulation;

a P type channel region, extending downward from said top surface, vertically partially overlapping said polysilicon gate;

two N+ source regions, disposed within said P channel region;

ohmic contacts to said source and gate;

a metallic layer on said emitter from a back side of said P+ silicon substrate;

a shunt region of N type silicon in contact with, and extending upward from, said P+ silicon substrate, through said high resistance body of N− silicon and terminating at a distance from said upper surface and underlying said polysilicon gate and not contacting said P type channel region; land wherein said distance is between about 0.5 and 5 microns.

* * * * *